(12) United States Patent
Ma et al.

(10) Patent No.: US 11,470,228 B2
(45) Date of Patent: Oct. 11, 2022

(54) CAMERA MODULE WITH SHAPE MEMORY ALLOY MOTOR AND ELECTRONIC DEVICE HAVING THE SAME

(71) Applicant: TRIPLE WIN TECHNOLOGY(SHENZHEN) CO.LTD., Shenzhen (CN)

(72) Inventors: Xiao-Mei Ma, Guangdong (CN); Shin-Wen Chen, New Taipei (TW); Long-Fei Zhang, Guangdong (CN); Kun Li, Guangdong (CN)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 208 days.

(21) Appl. No.: 16/899,781

(22) Filed: Jun. 12, 2020

(65) Prior Publication Data
US 2021/0176380 A1    Jun. 10, 2021

(30) Foreign Application Priority Data
Dec. 5, 2019  (CN) .......................... 201922162419.8

(51) Int. Cl.
| | |
|---|---|
| H04N 5/225 | (2006.01) |
| H05K 1/18 | (2006.01) |
| F03G 7/06 | (2006.01) |
| G03B 5/00 | (2021.01) |
| G02B 7/08 | (2021.01) |

(52) U.S. Cl.
CPC .......... *H04N 5/2254* (2013.01); *F03G 7/065* (2013.01); *G02B 7/08* (2013.01); *G03B 5/00* (2013.01); *H04N 5/2252* (2013.01); *H04N 5/2253* (2013.01); *H05K 1/182* (2013.01); *G03B 2205/0076* (2013.01); *H05K 2201/10151* (2013.01)

(58) Field of Classification Search
CPC .. H04N 5/2254; H04N 5/2252; H04N 5/2253; H04N 5/2257; F03G 7/065; G02B 7/08; G02B 27/646; G03B 5/00; G03B 2205/0076; G03B 3/00; G03B 30/00; H05K 1/182; H05K 2201/10151; H05K 1/189; H05K 3/4691; H05K 2201/10121
USPC ....................................................... 348/374
See application file for complete search history.

(56) References Cited

U.S. PATENT DOCUMENTS

| | | | | |
|---|---|---|---|---|
| 5,731,909 | A * | 3/1998 | Schachar | F03G 7/06 359/666 |
| 7,359,124 | B1 * | 4/2008 | Fang | G02B 3/14 359/666 |
| 7,397,066 | B2 * | 7/2008 | Oliver | H01L 27/14634 257/466 |
| 9,041,851 | B2 * | 5/2015 | Forrest | B29D 11/023 348/345 |
| 9,164,202 | B2 * | 10/2015 | Batchko | G02B 3/12 |
| 10,928,558 | B1 * | 2/2021 | Cooke | G02B 26/06 |

(Continued)

FOREIGN PATENT DOCUMENTS

CN    208207475 U    12/2018

*Primary Examiner* — Usman A Khan
(74) *Attorney, Agent, or Firm* — ScienBiziP, P.C.

(57) ABSTRACT

A camera module includes a circuit board; and a lens module electrically connected with the circuit board. The lens module is configured to be capable of deformed when being applied a voltage thereon so as to change a focus length of the lens module.

16 Claims, 5 Drawing Sheets

(56) References Cited

U.S. PATENT DOCUMENTS

| | | | | |
|---|---|---|---|---|
| 2006/0028734 A1* | 2/2006 | Kuiper | ................. | G02B 26/005 |
| | | | | 359/676 |
| 2007/0263293 A1* | 11/2007 | Batchko | ............... | G02B 26/004 |
| | | | | 359/666 |
| 2008/0144185 A1* | 6/2008 | Wang | ....................... | G02B 3/14 |
| | | | | 235/472.01 |
| 2008/0218873 A1* | 9/2008 | Batchko | ................. | F03G 7/065 |
| | | | | 359/665 |
| 2009/0310209 A1* | 12/2009 | Aschwanden | ....... | G02B 5/1847 |
| | | | | 359/666 |
| 2010/0123007 A1* | 5/2010 | Wittenberg | .......... | G02B 26/005 |
| | | | | 235/454 |
| 2012/0194929 A1* | 8/2012 | Nakahira | ................. | G02B 7/04 |
| | | | | 359/823 |
| 2017/0315274 A1* | 11/2017 | Park | ........................ | G02B 3/00 |
| 2019/0158749 A1* | 5/2019 | Kunick | ................ | H04N 5/2254 |
| 2020/0224784 A1* | 7/2020 | Hasan | ................... | F16K 31/047 |

* cited by examiner

CAMERA MODULE WITH SHAPE MEMORY ALLOY MOTOR AND ELECTRONIC DEVICE HAVING THE SAME

The subject matter herein generally relates to optical technologies and particularly relates to a camera module and an electronic device.

BACKGROUND

With the development of multimedia technology, electronic devices such as cameras are more and more popular with consumers, and a frequency of users' use of cameras is also greatly increased, and the requirements for camera imaging performance (such as pixel) are also higher and higher.

In order to improve the camera pixels, it is necessary to shorten the depth of field of a lens, resulting in a smaller and smaller range of clear shooting of the fixed focus mode group. The traditional solution is to add a voice coil motor to the lens module, which can push the lens to move to achieve the focusing function. However, with the increase of pixels, the size of the voice coil motor is becoming larger and larger, which is not conducive to the realization of light and thin electronic devices. At the same time, the voice coil motor is slow in focusing, and there is abnormal noise when focusing. At the same time, the abnormal noise and shaking of the lens during focusing will cause image blur.

BRIEF DESCRIPTION OF THE DRAWINGS

Implementations of the present disclosure will now be described, by way of embodiment, with reference to the attached figures.

DETAILED DESCRIPTION

Figure 1:
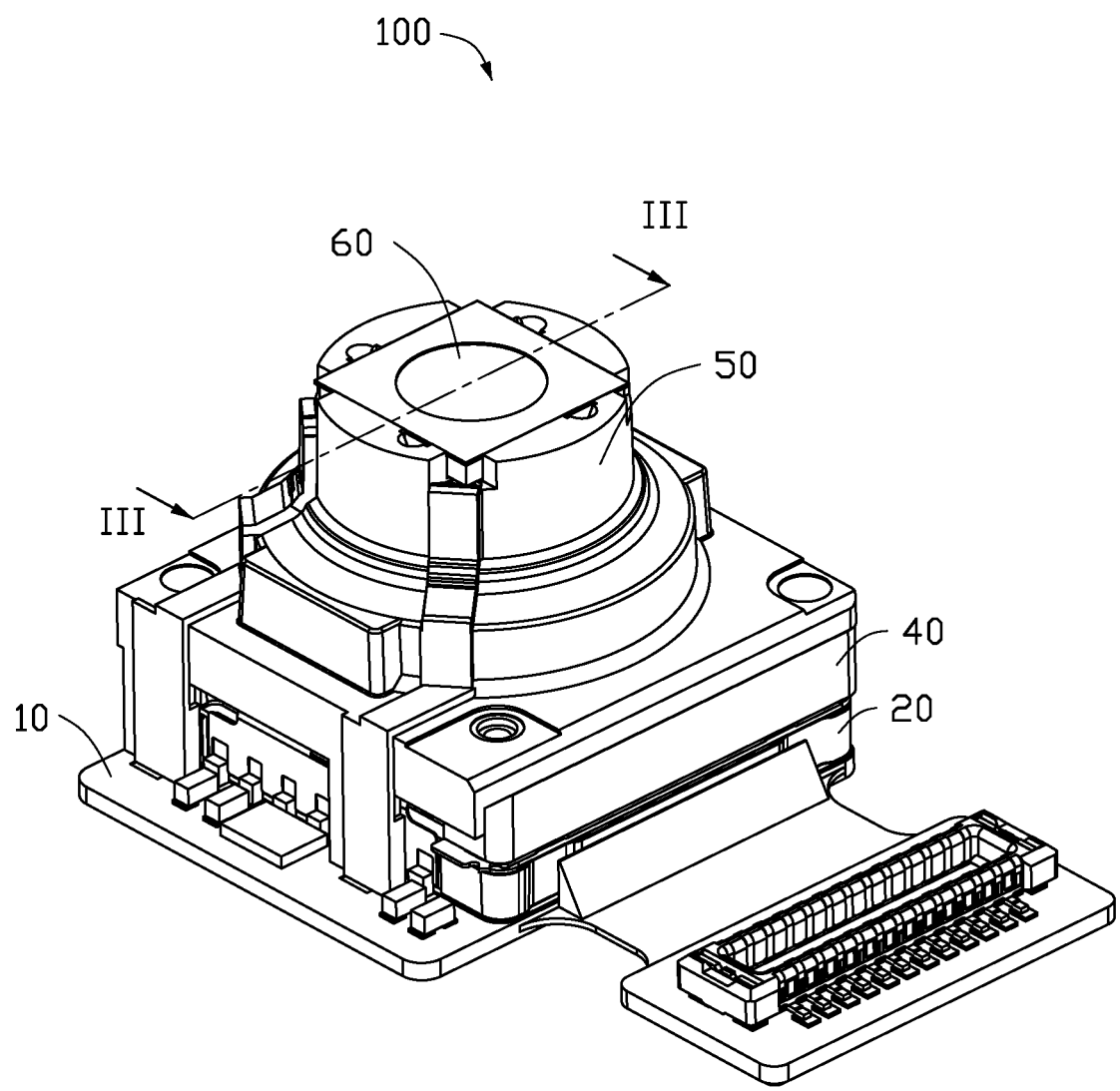
FIG. 1 illustrates an embodiment of a schematic diagram of a camera module.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". In addition, the terms "first" and "second" are used for descriptive purposes only and cannot be understood as indicating or implying relative importance or implying the number of indicated technical features. Thus, the features defined as "first" and "second" may explicitly or implicitly include one or more of the said features. In the description of embodiments of the invention, "multiple" means two or more, unless otherwise specifically defined.

The terms "center", "length", "width", "thickness", "top", "bottom", "front", "back", "left", "right", "vertical", "horizontal", "inside", "outside", and other indicating directions or positions are based on the directions or positions shown in the attached drawings. In order to facilitate the description of the embodiment and simplify the description of the invention, rather than indicating or implying that the device or element referred to must have a specific orientation, be constructed and operated in a specific orientation, it cannot be understood as a limitation of the embodiment of the invention.

Figure 2:
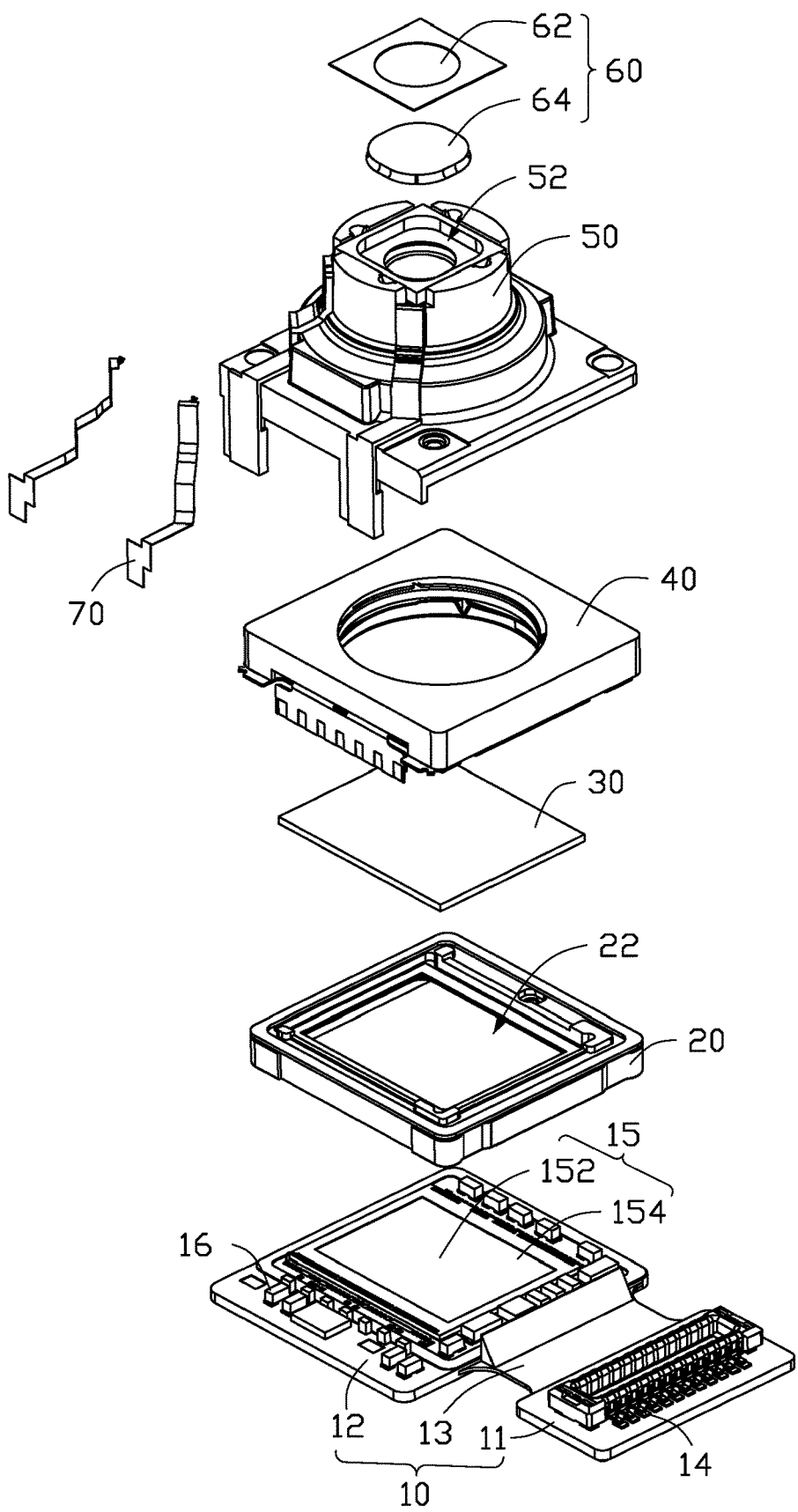
FIG. 2 illustrates an exploded view of the camera module of FIG. 1.
Figure 3:
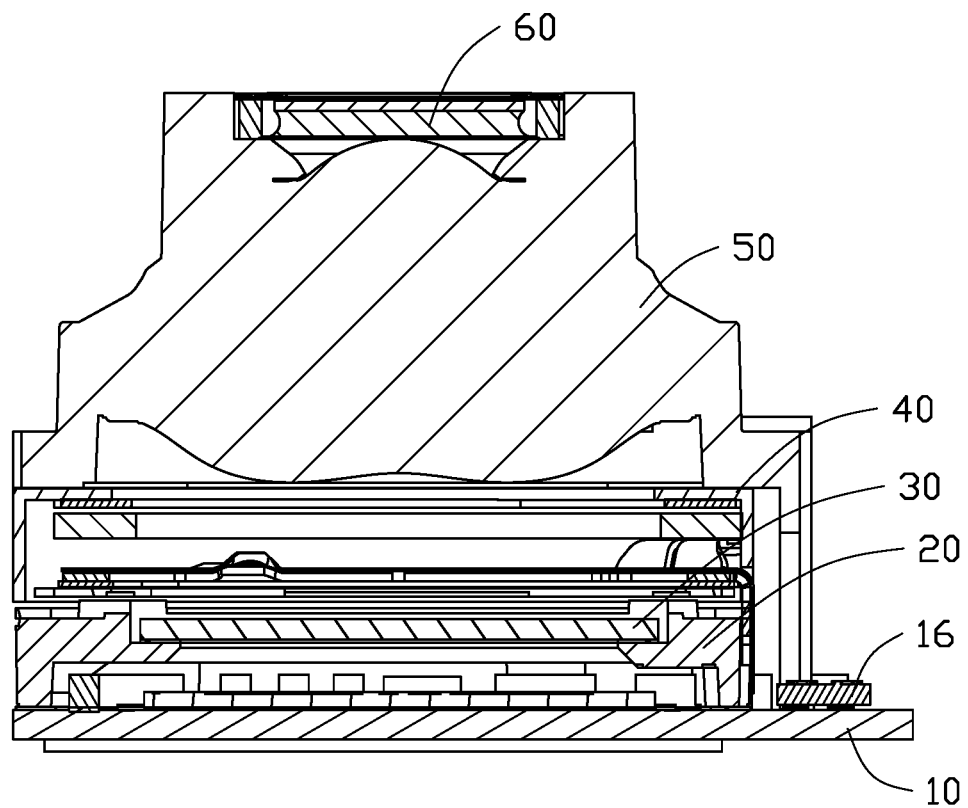
FIG. 3 illustrates a cross-sectional view of the camera module of FIG. 1 along a line III-III.

Referring to FIGS. 1-3, an embodiment of the disclosure provides a camera module 100. The camera module 100 includes a circuit board 10, a base 20, a lens holder 50, a lens module 60, a shape memory alloys (SMA) motor 40, and an electrical connecting member 70.

The circuit board 10 can be a soft board, a hard board or a soft and hard combination board. In this embodiment, the circuit board 10 is a soft and hard combination board. The circuit board 10 includes a first hard board 11, a second hard board 12, and a soft board 13 arranged between the first hard board 11 and the second hard board 12. An electrical connecting part 14 is mounted on a side of the second hard board 12. The electrical connecting part 14 is configured to transmit electronic signals between the camera module 100 and an electronic device 200. The electrical connecting part 14 can be a socket or a gold finger.

An optical sensor 15 and a plurality of electronic components 16 are mounted on a side of the first hard board 11. The optical sensor 15, the electronic components 16, and the electrical connecting part 14 are mounted on the same side of the first hard board 11. The electronic components 16 can be passive components including, but not limited to, a resistance, a capacitance, a diode, a triode, a relay, an electrified erasable programmable read only memory (EEPROM). In at least one embodiment, the electronic components 16 and the electrical connecting part 14 are respectively arranged on the opposite side of the circuit board 10.

The base 20 is arranged on the circuit board 10, the base 20 and the optical sensor 15 are mounted on the same side of the first hard board 11. The optical sensor 15 includes a photosensitive area 152 and an edge area 154 surrounding the photosensitive area 152. The base 20 is connected to the circuit board 10 through adhesive layers like gel. The base 20 is in a hollow structure and defines a first through hole 22. The first through hole 22 is circular and is corresponding to the photosensitive area 152 of the optical sensor 15.

The camera module 100 includes a filter 30 arranged inside the base 20. The filter 30 is arranged above the photosensitive area 152 to cover the photosensitive area 152.

Figure 4:
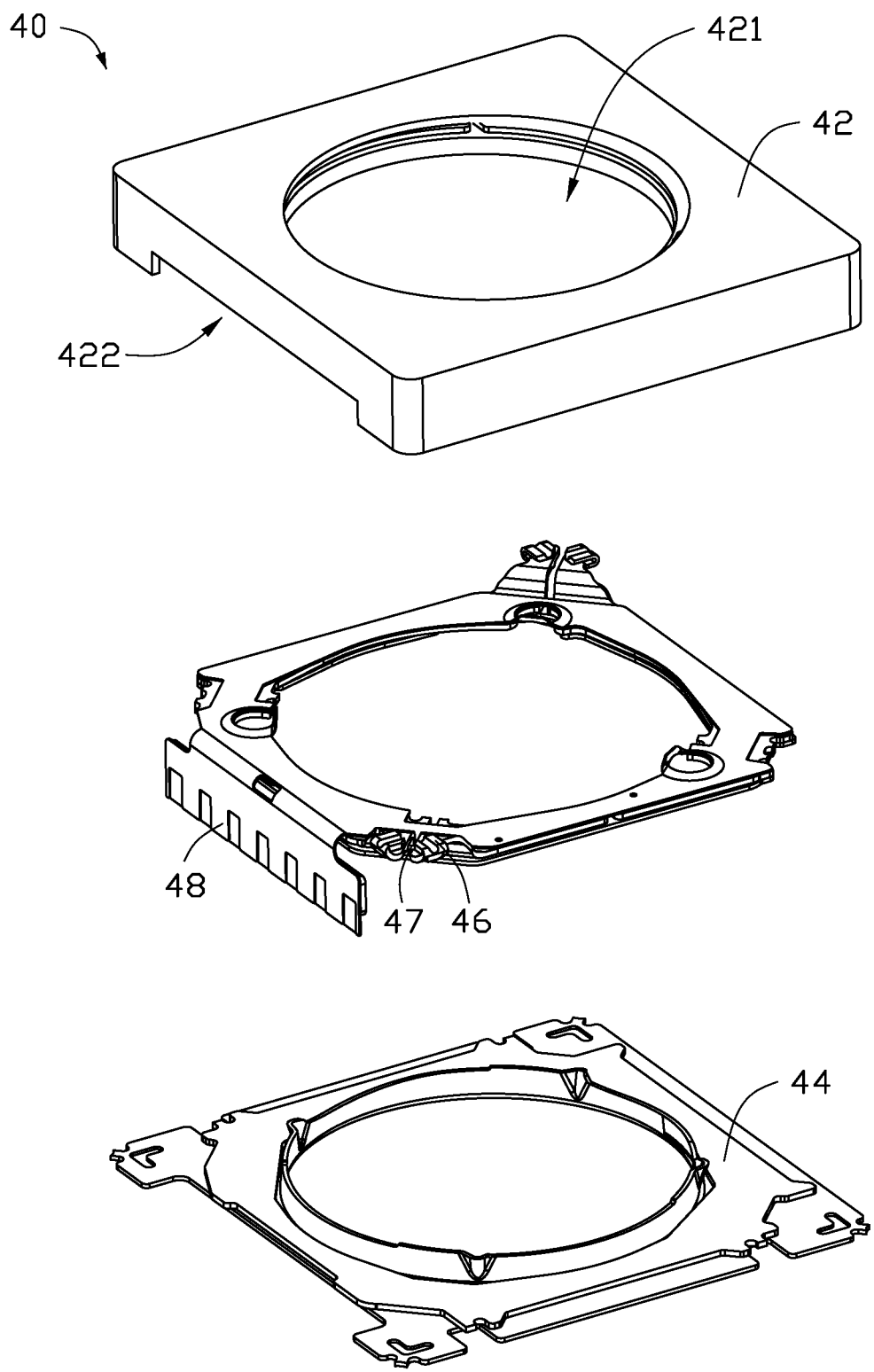
FIG. 4 illustrates an exploded view of a motor of the camera module of FIG. 1.

Referring to FIG. 4, the SMA motor 40 includes a case 42, a seat 44, and a plurality of connecting members 46. The case 42 is in a rectangular shape and defines a second through hole 421 at a center thereof. The second through hole 421 is corresponding to the photosensitive area 152. The case 42 includes a top wall (not labeled) and a plurality of side walls (not labeled) extending downwardly from the top wall. The side walls are substantially perpendicular to the top wall. The top wall together with the side walls forms a receiving area (not labeled) for accommodating the seat 44 and the plurality of connecting members 46. The side walls of the case 42 defines an opening 422. The seat 44 is configured to support the plurality of connecting member 46. The plurality of connecting members 46 are connected by shape memory alloy wires 47 on a same plane. The plurality of connecting members 46 are connected to the circuit board 10 by a conductor 48. Part of the conductor 48 is exposed through the opening 422 so that the part of the conductor 48 can be connected to the circuit board through the solder past (not shown).

In the embodiment, a number of the plurality of connecting members 46 is four, and a number of the shape memory alloy wires 47 are four. Each shape memory alloy wire 47 interconnects adjacent connecting members 46. If an external force, such as a force generated due to vibration, is exerted on the camera module 100, the shape memory alloy wires 47 are powered up and deformed, so as to adjust relative positions of the plurality of connecting members 46, and to perform vibration compensation, thus compensating the vibration to keep an optical path stable and an image taken by the lens module clear.

In the embodiment, the SMA motor 40 is arranged on a surface of the base 20 away from the circuit board 10, and is connected with the base 20 by adhesive layers like gel. The SMA motor 40 is electrically connected to the circuit board 10.

The lens holder 50 is arranged on a side of the case 42 away from the circuit board 10 and is configured to support the lens module 60.

In the embodiment, the lens holder 50 defines an accommodating area 52 for accommodating the lens module 60. The lens holder 50 and the lens module 60 can be mounted together or can be integrally formed. In the embodiment, the lens holder 50 and the lens module 60 are mounted together.

The lens module 60 has a zoom function, that is, the lens module 60 is electrically connected with the circuit board 10 through electrical connecting member 70. The circuit board 10 is configured to control the lens module 60 to perform zoom function.

The lens module 60 includes a first lens 62 and a second lens 64. The first lens 62 is arranged at a side of the second lens 64 away from the circuit board 10. The first lens 62 is electrically connected with the circuit board 10 through electrical connecting member 70. When a voltage from the circuit board 10 is applied to the first lens 62, the first lens 62 is deformed so as to change its focal length. Therefore, the focal length of the first lens 62 can be adjusted by changing the value of the voltage applied to the first lens 62. Light sequentially passes through the first lens 62 and the second lens 64 and then converges on the sensor 15 to form an image. In such way, the first lens 62 can cooperate with the second lens 64 to achieve the desired optical effect.

The electrical connecting member 70 can be made of conductive material, such as metal, metal alloy, and high polymer material capable of conduct electricity. In the embodiment, the electrical connecting member 70 is a piece of metal which is integrally formed with the camera module 100 by insert molding. The electrical connecting member 70 interconnects the circuit board 10 and the lens module 60 so as to achieve an electrical connection between the circuit board 10 and the lens module 60. In at least one embodiment, the electrical connecting member 70 includes two pieces of metal respectively acting as a positive electrode and a negative electrode.

In at least one embodiment, the electrical connecting member 70 passes through inside the lens holder 50 and extends to the circuit board 10. In this way, the electrical connecting member 70 can be protected from damage.

In at least one embodiment, the lens holder 50 is arranged at a side of the base 20 away from the circuit board 10, and the SMA motor 40 is arranged at a side of the lens holder 50 away from the base 20. The SMA motor 40 is arranged between the lens module 60 and the lens holder 50. In this case, the plurality of connecting members 46 connected with the shape memory alloy wires 47 can be arranged inside the lens holder 50. The plurality of connecting members 46 and the lens module 60 are electrically connected to the circuit board 10 by electrical connecting members 70.

Figure 5:
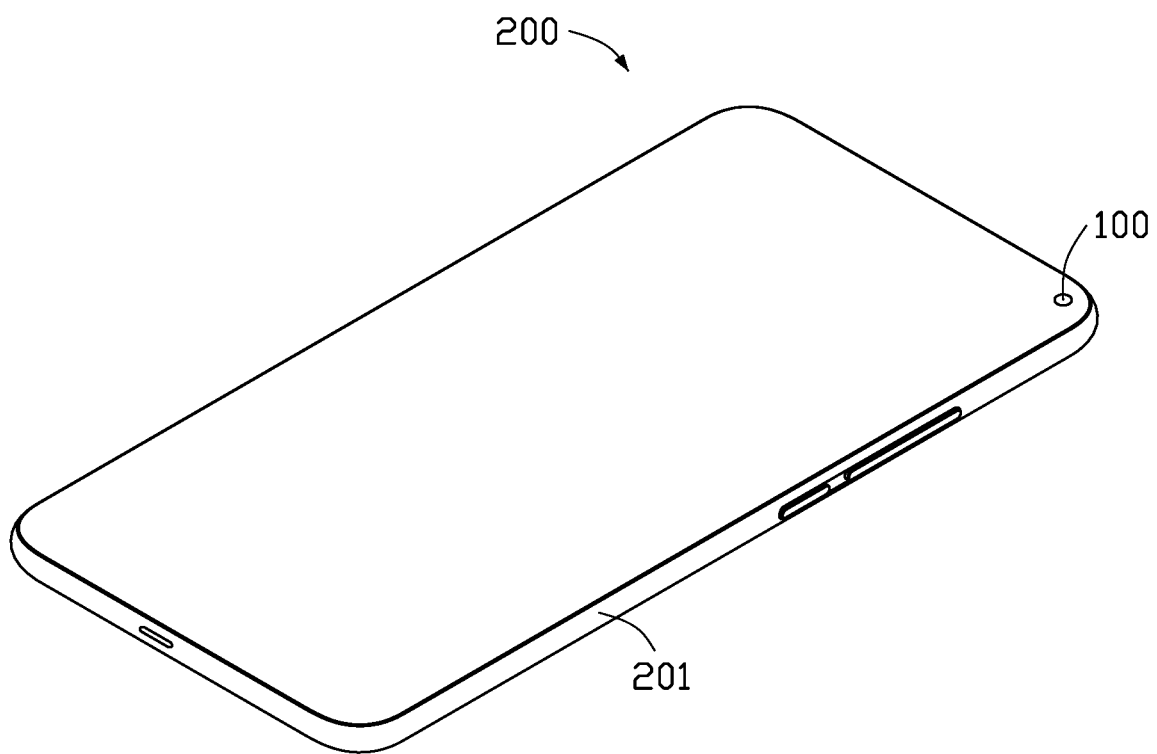
FIG. 5 illustrates an embodiment of a schematic diagram of an electronic device.

Referring to FIG. 5, the camera module 100 can be used in an electronic device 200. The electronic device 200 can be, but not limited to, a mobile phone, a wearable device, a computer device, a mobile platform, or a monitoring device. In this embodiment, the camera module 100 is used in a mobile phone. The electronic device includes a main body 201 and the camera module 100. The camera module 100 is arranged on the main body 201.

The camera module 100 of the present disclosure can focus quickly by changing the voltage supplied from the circuit board 10 to the lens module 60. In addition, the camera module 100 can perform vibration compensation by the SMA motor 40. Therefore, the camera module 100 can improve imaging quality.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A camera module, comprising:
   a circuit board;
   a lens module electrically connected with the circuit board, wherein the lens module is configured to be capable of being deformed when being applied a voltage thereon so as to change a focus length of the lens module;
   a shape memory alloy motor arranged between the lens module and the circuit board, wherein the shape memory alloy motor is electrically connected with the circuit board and configured to be capable of compensating vibration of the lens module; the shape memory alloy motor comprises a case, a seat, and a plurality of connecting members electrically connected to the circuit board, the seat and the plurality of connecting members are arranged inside the case, the seat is configured to support the plurality of connecting member, the plurality of connecting members are connected by shape memory alloy wires at a same plane.

2. The camera module according to claim 1, further comprising a lens holder configured to support the lens module, wherein the shape memory alloy motor is arranged between the lens holder and the circuit board.

3. The camera module according to claim 1, further comprising a lens holder configured to support the lens module, wherein the shape memory alloy motor is arranged between the lens module and the lens holder.

4. The camera module according to claim 1, wherein the plurality of connecting members are connected with the circuit board by a conductor.

5. The camera module according to claim 4, wherein the case defines an opening, part of the conductor is exposed through the opening so that the part of the conductor can be connected to the circuit board through solder past.

6. The camera module according to claim 1, wherein the lens module comprises a first lens electrically connected with the circuit board, and a second lens arranged between the first lens and circuit board.

7. The camera module according to claim 6, wherein the first lens is connected with the circuit board by an electrical connecting member.

8. The camera module according to claim 7, wherein the electrical connecting member is one of: metal, metal alloy, and high polymer material capable of conduct electricity.

9. An electronic device, comprising:
a main body; and
a camera module, arranged on the main body; the camera module comprising:
  a circuit board;
  a lens module electrically connected with the circuit board, wherein the lens module is configured to be capable of being deformed when being applied a voltage thereon so as to change a focus length of the lens module;
  a shape memory alloy motor arranged between the lens module and the circuit board, wherein the shape memory alloy motor is electrically connected with the circuit board and configured to be capable of compensating vibration of the lens module; the shape memory alloy motor comprises a case, a seat, and a plurality of connecting members electrically connected to the circuit board, the seat and the plurality of connecting members are arranged inside the case, the seat is configured to support the plurality of connecting member, the plurality of connecting members are connected by shape memory alloy wires at a same plane.

10. The electronic device according to claim 9, wherein the camera module comprises a lens holder configured to support the lens module, the shape memory alloy motor is arranged between the lens holder and the circuit board.

11. The electronic device according to claim 9, wherein the camera module comprises a lens holder configured to support the lens module, the shape memory alloy motor is arranged between the lens module and the lens holder.

12. The electronic device according to claim 9, wherein the plurality of connecting members are connected with the circuit board by a conductor.

13. The electronic device according to claim 12, wherein the case defines an opening, part of the conductor is exposed through the opening so that the part of the conductor can be connected to the circuit board through solder past.

14. The electronic device according to claim 9, wherein the lens module comprises a first lens electrically connected with the circuit board, and a second lens arranged between the first lens and circuit board.

15. The electronic device according to claim 14, wherein the first lens is connected with the circuit board by an electrical connecting member.

16. The electronic device according to claim 15, wherein the electrical connecting member is one of: metal, metal alloy, and high polymer material capable of conduct electricity.

* * * * *